(12) United States Patent
Jung et al.

(10) Patent No.: US 11,264,442 B2
(45) Date of Patent: Mar. 1, 2022

(54) FLAT PANEL DISPLAY INCLUDING PLURALITY OF PADS

(71) Applicant: Samsung Display CO., LTD., Yongin-si (KR)

(72) Inventors: Young Taeg Jung, Yongin-si (KR); Seung Kyu Lee, Yongin-si (KR); Hyun Woong Kim, Yongin-si (KR); Hyun Chol Bang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 720 days.

(21) Appl. No.: 16/161,648

(22) Filed: Oct. 16, 2018

(65) Prior Publication Data

US 2019/0288053 A1 Sep. 19, 2019

(30) Foreign Application Priority Data

Mar. 19, 2018 (KR) .................. 10-2018-0031426

(51) Int. Cl.
*H01L 27/32* (2006.01)
*G09G 3/00* (2006.01)
(Continued)

(52) U.S. Cl.
CPC ........ *H01L 27/3276* (2013.01); *G06F 3/0412* (2013.01); *G06F 3/0418* (2013.01); *G09G 3/006* (2013.01); *G09G 3/3266* (2013.01); *G09G 3/3275* (2013.01); *H01L 27/323* (2013.01); *G09G 2300/0426* (2013.01)

(58) Field of Classification Search
CPC ... H01L 27/32; H01L 27/3225; H01L 27/323; H01L 27/3241; H01L 27/3244; H01L 27/3276; G09G 3/006; G09G 3/30; G09G 3/32; G09G 3/3208; G09G 3/3266; G09G 3/3275; G06F 3/041; G06F 3/0412; G06F 3/0416; G06F 3/0418
See application file for complete search history.

(56) References Cited

U.S. PATENT DOCUMENTS 8,749,262 B2 6/2014 Jung et al.
2007/0046336 A1* 3/2007 Kang .................. G02F 1/13458
326/101

(Continued)

FOREIGN PATENT DOCUMENTS

KR 10-0897982 5/2009
KR 1020130031054 3/2013
KR 10-1783953 9/2017

*Primary Examiner* — Huy Q Phan
*Assistant Examiner* — David B Frederiksen
(74) *Attorney, Agent, or Firm* — F. Chau & Associates, LLC

(57) ABSTRACT

A flat panel display includes a substrate including a display region and a non-display region disposed outside of the display region, a display unit disposed in the display region that displays an image, a plurality of first pads disposed in the non-display region that receive driving signals for driving the display unit, a plurality of second pads disposed in the non-display region that receive inspection signals for inspecting the display unit, a plurality of third pads disposed in the non-display region that receive alignment confirmation signals for confirming alignment, and a resistor coupled between at least two third pads of the plurality of third pads.

18 Claims, 10 Drawing Sheets

(51) Int. Cl.
   *G09G 3/3275*   (2016.01)
   *G09G 3/3266*   (2016.01)
   *G06F 3/041*    (2006.01)

(56) References Cited

U.S. PATENT DOCUMENTS

| | | | | |
|---|---|---|---|---|
| 2008/0251787 | A1* | 10/2008 | Kim | H01L 22/32 |
| | | | | 257/48 |
| 2011/0018571 | A1* | 1/2011 | Kim | G02F 1/1345 |
| | | | | 324/760.02 |
| 2014/0092335 | A1* | 4/2014 | Agata | G02F 1/13452 |
| | | | | 349/47 |
| 2015/0145541 | A1* | 5/2015 | Kudo | G09G 3/006 |
| | | | | 324/750.19 |
| 2015/0234537 | A1* | 8/2015 | Kusuda | G06F 3/0446 |
| | | | | 345/178 |
| 2015/0301420 | A1* | 10/2015 | Yoshida | G02F 1/136286 |
| | | | | 257/43 |
| 2016/0139191 | A1* | 5/2016 | Yashiro | G06F 3/0445 |
| | | | | 324/750.16 |
| 2017/0146567 | A1* | 5/2017 | Yue | G02F 1/1309 |
| 2018/0188289 | A1* | 7/2018 | Qu | G01R 1/06794 |

* cited by examiner

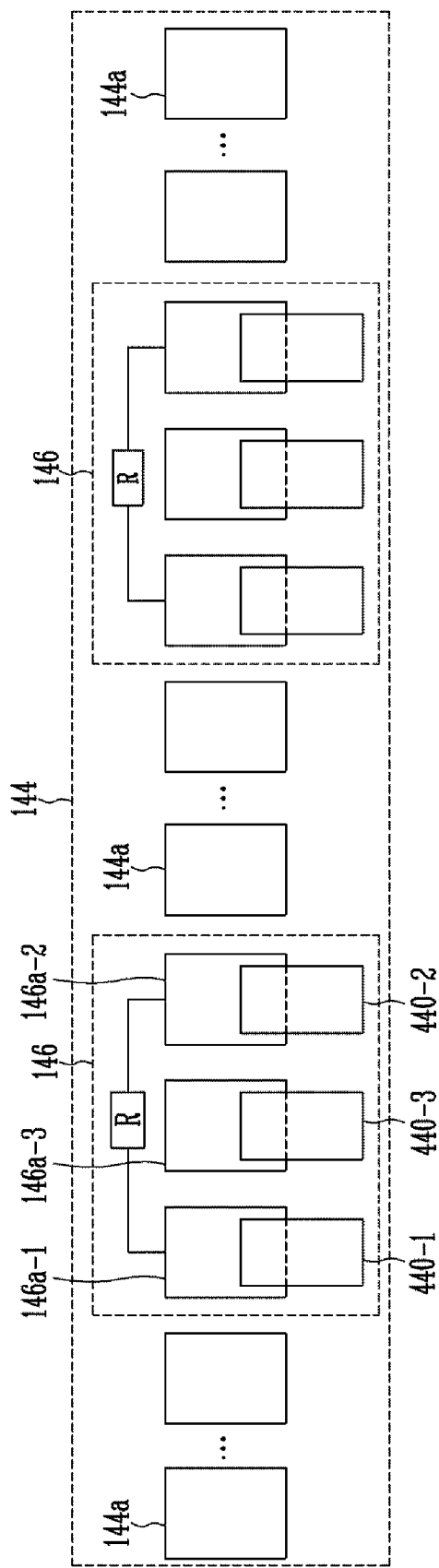

FLAT PANEL DISPLAY INCLUDING PLURALITY OF PADS

CROSS-REFERENCE TO RELATED APPLICATIONS

This application claims priority under 35 U.S.C. § 119 to Korean Patent Application No. 10-2018-0031426, filed on Mar. 19, 2018, the disclosure of which is incorporated by reference herein in its entirety.

TECHNICAL FIELD

Exemplary embodiments relate to a flat panel display having inspection pads for inspecting a display unit.

DISCUSSION OF THE RELATED ART

Flat panel displays, such as liquid crystal displays (LCDs) and organic light emitting diode displays (OLEDs), are complex in structure and function and are expensive to manufacture. Thus, it is desirable to detect defects in flat panel displays early in the manufacturing process. Accordingly, techniques are being developed to reduce inspection time and increase inspection accuracy.

SUMMARY

Exemplary embodiments of the present invention provide a flat panel display capable of efficiently and accurately detecting misalignment between probes of an inspection apparatus and inspection pads of the flat panel display.

Exemplary embodiments of the present invention provide a flat panel display capable of reducing a defect rate in the manufacturing process by effectively detecting misalignment between the probes of the inspection apparatus and the inspection pads of the flat panel display.

According to an exemplary embodiment of the present invention, a flat panel display includes a substrate including a display region and a non-display region disposed outside of the display region, a display unit disposed in the display region that displays an image, a plurality of first pads disposed in the non-display region that receive driving signals for driving the display unit, a plurality of second pads disposed in the non-display region that receive inspection signals for inspecting the display unit, a plurality of third pads disposed in the non-display region that receive alignment confirmation signals for confirming alignment, and a resistor coupled between at least two third pads of the plurality of third pads.

In an exemplary embodiment, the display unit includes a plurality of scan lines arranged in a first direction, a plurality of data lines arranged in a second direction that crosses the first direction, and a plurality of pixels coupled to the plurality of scan lines and the plurality of data lines. Each pixel includes a light emitting element, and a thin film transistor coupled to the light emitting element.

In an exemplary embodiment, the display unit further includes a touch sensing unit, and the inspection signals for inspecting the display unit include signals for inspecting the touch sensing unit.

In an exemplary embodiment, the plurality of third pads is disposed on both sides of the plurality of second pads.

In an exemplary embodiment, the plurality of third pads includes a first group of third pads and a second group of third pads, the first group and the second group are disposed apart from each other, and some of the plurality of second pads are disposed between the first group and the second group.

In an exemplary embodiment, the plurality of probes of the inspection apparatus contacts the plurality of second pads and the plurality of third pads, and a resistance value of the resistor is larger than a resistance value of the probes of the inspection apparatus.

In an exemplary embodiment, the plurality of third pads includes a first third pad that receives one of the alignment confirmation signals, and a second third pad that outputs the received one alignment confirmation signal.

According to an exemplary embodiment of the present invention, a flat panel display includes a substrate including a display region and a non-display region disposed outside of the display region, a display unit disposed in the display region that displays an image, a plurality of first pads, a plurality of second pads, a plurality of third pads, and a resistor. The plurality of first pads is disposed in the non-display region and is coupled to a plurality of driving signal lines. The driving signal lines are disposed in the non-display region and connected to the display unit, and transmit a plurality of driving signals used to drive the display unit from the first pads to the display unit. The plurality of second pads is disposed in the non-display region and coupled to a plurality of inspection signal lines. The inspection signal lines are disposed in the non-display region and connected to the display unit, and transmit a plurality of inspection signals used to inspect the display unit from the second pads to the display unit. The plurality of third pads is disposed in the non-display region. The resistor is coupled between at least two third pads of the plurality of third pads.

In an exemplary embodiment, the plurality of third pads is disposed on both sides of the plurality of second pads.

In an exemplary embodiment, the plurality of third pads includes a first group of third pads and a second group of third pads. The first group and the second group are disposed apart from each other, and some of the plurality of second pads are disposed between the first group and the second group.

In an exemplary embodiment, the inspection signals are applied to the second pads via a plurality of probes of an inspection apparatus via the probes contacting the second pads.

In an exemplary embodiment, the display unit includes a touch sensing unit, and the inspection signals include signals used to inspect the touch sensing unit.

In an exemplary embodiment, the third pads receive a plurality of alignment confirmation signals used to confirm alignment between a plurality of probes of an inspection apparatus and the second pads via the probes contacting the third pads.

In an exemplary embodiment, the plurality of third pads includes a first third pad that receives one of the alignment confirmation signals, and a second third pad that outputs the received one alignment confirmation signal.

In an exemplary embodiment, a resistance value of the resistor is larger than a resistance value of the probes of the inspection apparatus.

In an exemplary embodiment, the inspection signal lines include disconnected ends.

In an exemplary embodiment, the second pads and the third pads are arranged at predetermined intervals along one side of the substrate.

According to an exemplary embodiment of the present invention, a method of inspecting a flat panel display for defects includes applying a plurality of inspection signals to the flat panel display via a plurality of second pads, and applying an alignment confirmation signal to a first third pad from among a plurality of third pads by bringing a first probe of a plurality of probes of an inspection apparatus into contact with the first third pad. The flat panel display includes a display region and a non-display region disposed outside of the display region. A plurality of first pads, the plurality of second pads, and the plurality of third pads are disposed in the non-display region. The method further includes applying a reference signal to a third third pad from among the plurality of third pads by bringing a second probe of the plurality of probes into contact with the third third pad. The method further includes detecting a voltage at a second third pad from among the plurality of third pads. The second third pad is electrically connected to the first third pad by a resistor. The method further includes comparing the voltage detected at the second third pad with a reference value, determining that the plurality of probes and the second pads are misaligned in response to the voltage detected at the second third pad being lower than the reference value, and determining that the plurality of probes and the second pads are aligned in response to the voltage detected at the second third pad being equal to at least the reference value.

In an exemplary embodiment, the reference signal applied to the third third pad is a ground voltage.

In an exemplary embodiment, a resistance value of the resistor is larger than a resistance value of the plurality of probes.

BRIEF DESCRIPTION OF THE DRAWINGS

The above and other features of the present invention will become more apparent by describing in detail exemplary embodiments thereof with reference to the accompanying drawings, in which:

FIG. 13 is a plan view illustrating second and third pad units according to an exemplary embodiment of the present invention.

DETAILED DESCRIPTION OF THE EXEMPLARY EMBODIMENTS

Figure 1:
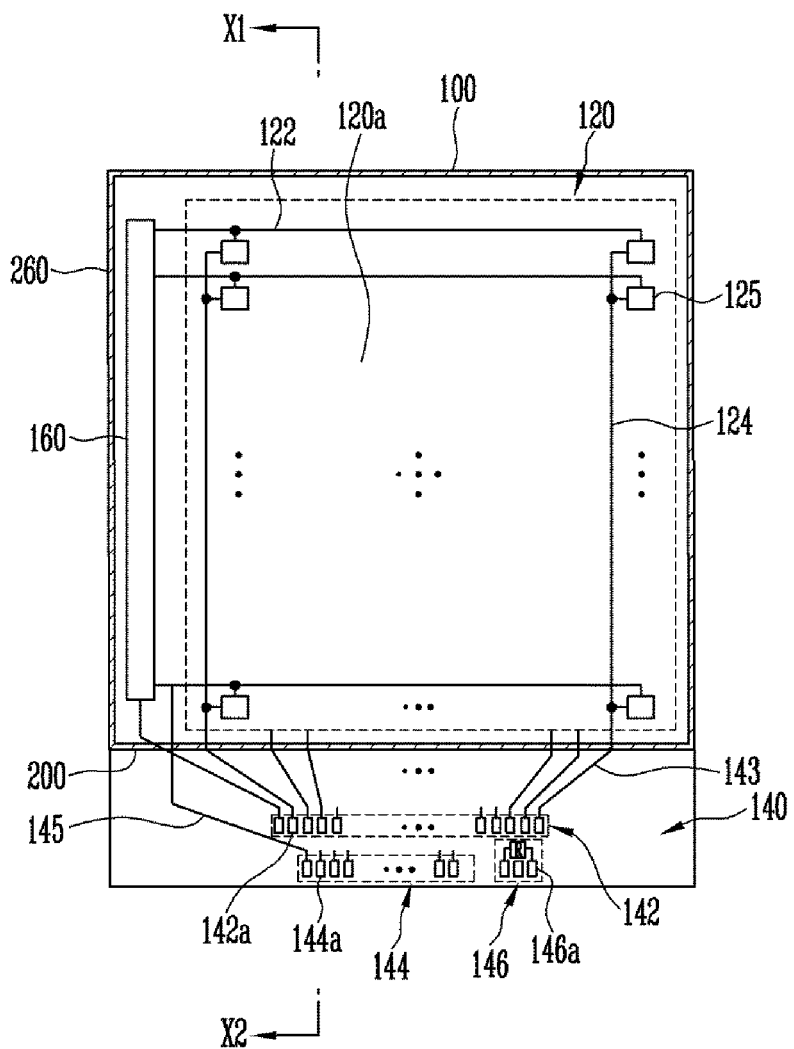
FIG. 1 is a plan view of a flat panel display according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when a component is referred to as being 'on', 'connected to', 'coupled to', or 'adjacent to' another component, it can be directly on, connected to, coupled to, or adjacent to the other component, or intervening components may also be present. It will also be understood that when a component is referred to as being 'between' two components, it can be the only component between the two components, or one or more intervening components may also be present. Further, as used herein, the singular forms "a", "an" and "the" are intended to include the plural forms as well, unless the context clearly indicates otherwise.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Figure 2:
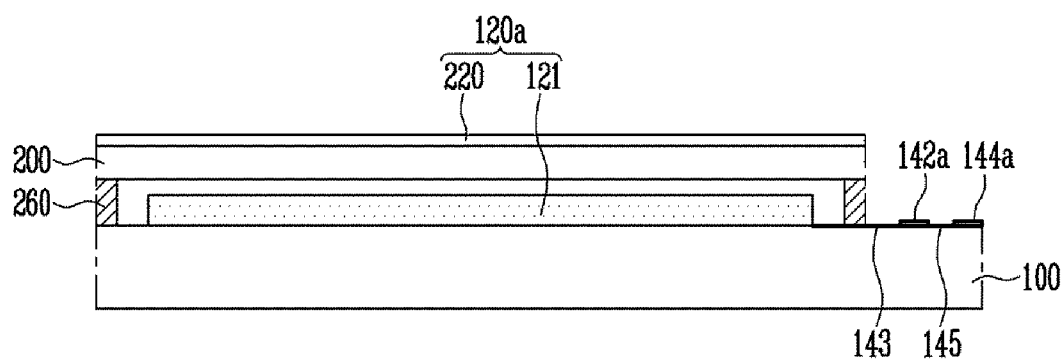
FIG. 2 is a cross-sectional view taken along line X1-X2 of FIG. 1.

FIG. 1 is a plan view of a flat panel display according to an exemplary embodiment of the present invention. FIG. 2 is a cross-sectional view taken along line X1-X2 of FIG. 1.

Referring to FIGS. 1 and 2, in an exemplary embodiment, the flat panel display includes a display unit 120a that displays an image.

In an exemplary embodiment, the display unit 120a includes a pixel array 121. In an exemplary embodiment, the display unit 120a further includes a touch sensing unit 220 that allows a user to input a command by touching the screen of the flat panel display. The touch sensing unit 220 may include a plurality of sensing electrodes that senses the touched position (e.g., that senses the location of the touch on the screen), and a plurality of sensing signal lines coupled to the plurality of sensing electrodes.

In an exemplary embodiment, the pixel array 121 is disposed between a first substrate 100 and a second substrate 200, and is sealed with a sealing material 260. In an exemplary embodiment, the touch sensing unit 220 is disposed on one side of the second substrate 200 so as to overlap the pixel array 121. In an exemplary embodiment, a thin sealing film replaces the second substrate 200.

The first and second substrates 100 and 200 may each be a rigid substrate made of, for example, glass, quartz, plastic, etc., and may be in the form of a plate, or each of the first and second substrates 100 and 200 may be a flexible substrate made of, for example, a plastic film.

The first substrate 100 includes a display region 120 and a non-display region 140 disposed outside of the display region 120. For example, the non-display region 140 may be defined as a region surrounding the display region 120.

The pixel array 121 is disposed in the display region 120. In an exemplary embodiment, the pixel array 121 includes a plurality of scan lines 122 arranged in a first direction, a plurality of data lines 124 arranged in a second direction crossing the first direction, and a plurality of pixels 125 coupled to the plurality of scan lines 122 and the plurality of data lines 124. The plurality of pixels 125 may be arranged, for example, in a matrix form.

In an exemplary embodiment, each of the plurality of pixels 125 includes a light emitting element and a pixel circuit that drives the light emitting element. The pixel circuit may include, for example, a thin film transistor that transmits a signal to the light emitting element, and a capacitor that maintains the signal.

Figure 3:
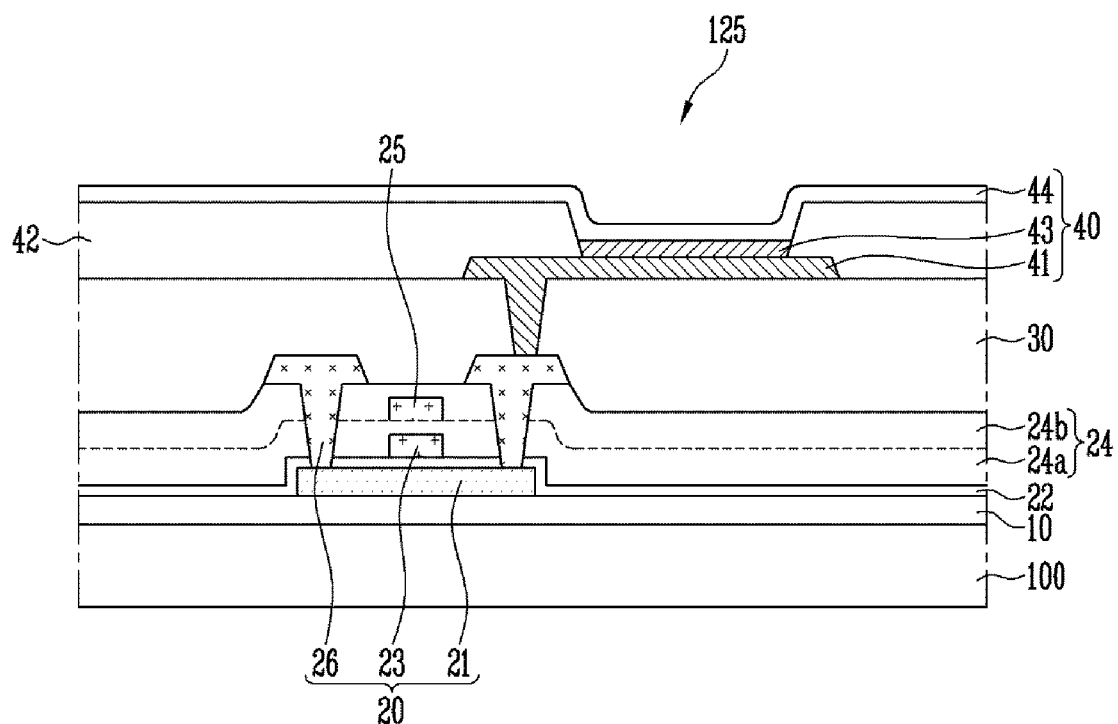
FIG. 3 is a cross-sectional view illustrating a pixel shown in FIG. 1 according to an exemplary embodiment of the present invention.

FIG. 3 is a cross-sectional view illustrating the pixel 125 shown in FIG. 1 according to an exemplary embodiment of the present invention.

The pixel 125 is disposed in the display region 120 of the first substrate 100.

In an exemplary embodiment, a buffer layer 10 is disposed on the first substrate 100. The buffer layer 10 blocks penetration of external air and planarizes the surface. A thin film transistor 20 is disposed on the buffer layer 10.

The thin film transistor 20 includes a semiconductor layer 21 that provides a source region, a drain region, and a channel region, a gate electrode 23 disposed on the semiconductor layer 21 of the channel region and electrically insulated from the semiconductor layer 21 by a gate insulating layer 22, and source and drain electrodes 26 electrically coupled to the semiconductor layer 21 of the source and drain regions.

The source and drain electrodes 26 may be electrically coupled to the semiconductor layer 21 of the source and drain regions through contact holes formed in an interlayer insulating layer 24.

In an exemplary embodiment, the interlayer insulating layer 24 includes a first interlayer insulating layer 24a and a second interlayer insulating layer 24b disposed on the first interlayer insulating layer 24a.

In an exemplary embodiment, the capacitor included in the pixel circuit includes a capacitor electrode 25 disposed between the first interlayer insulating layer 24a and the second interlayer insulating layer 24b so as to overlap the gate electrode 23. In an exemplary embodiment, the capacitor is formed by the gate electrode 23, the first interlayer insulating layer 24a, and the capacitor electrode 25 disposed so as to overlap one another.

In an exemplary embodiment, a light emitting element 40 is disposed on an upper portion of the first substrate 100, which includes the thin film transistor 20 and the capacitor. The light emitting element 40 may include, for example, an organic light emitting diode (OLED).

In an exemplary embodiment, a planarization layer 30 is provided on the first substrate 100 including the thin film transistor 20 and the capacitor. A first electrode 41 is disposed on the planarization layer 30. The first electrode 41 may be, for example, an anode electrode. The first electrode 41 may be electrically coupled to the source or drain electrode 26 through a via hole formed in the planarization layer 30.

In an exemplary embodiment, a pixel defining layer 42 is disposed on the planarization layer 30 including the first electrode 41, so that the first electrode 41 of a light emitting region is exposed. In an exemplary embodiment, an organic layer 43 is disposed on the exposed first electrode 41.

The organic layer 43 may include, for example, a hole injection layer, a hole transporting layer, an organic light emitting layer, an electron transporting layer, and an electron injecting layer. The organic layer 43 may further include, for example, an auxiliary layer or an intermediate layer.

In an exemplary embodiment, a second electrode 44 is disposed on the pixel defining layer 42 including the organic layer 43. The second electrode 44 may be, for example, a cathode electrode.

Although the flat panel display according to the exemplary embodiments described above is described as being an organic light emitting display, exemplary embodiments of the present invention are not limited thereto. For example, according to exemplary embodiments, the flat panel display may be a liquid crystal display.

In an exemplary embodiment, a first pad unit 142, a second pad unit 144, and a third pad unit 146 are disposed in the non-display region 140 of the first substrate 100. The first pad unit 142 receives driving signals that are used to drive the display unit 120a, the second pad unit 144 receives inspection signals that are used to inspect the display unit 120a (e.g., to inspect the display unit 120a for defects), and the third pad unit 146 receives alignment confirmation signals that are used to confirm alignment. The driving signals, the inspection signals, and the alignment confirmation signals are respectively applied to the first pad unit 142, the second pad unit 144, and the third pad unit 146 from outside of the display unit 120a.

The first pad unit 142 may also be referred to herein as a first pad group, the second pad unit 144 may also be referred to herein as a second pad group, and the third pad unit 146 may also be referred to herein as a third pad group. As shown in FIG. 1, each of the first to third pad groups are separately disposed in different areas in the non-display region 140. For example, the second and third pad groups are disposed closer to an edge of the first substrate 100 than the first pad group, which is disposed between the display unit 120a and the second and third pad groups. In an exemplary embodiment, a space between each of the pad groups is greater than the spaces between the pads within each of the pad group.

In an exemplary embodiment, the first pad unit 142 is disposed adjacent to an edge of the first substrate 100. As a result, the signals provided from the outside of the display unit 120a can be conveniently provided to the display unit 120a. In an exemplary embodiment, the first pad unit 142 includes a plurality of first pads 142a that receives various driving signals that are used to display an image. The driving signals received by the first pads 142a may include, for example, a scan signal, a data signal, a driving voltage, etc.

In an exemplary embodiment, the plurality of first pads 142a is electrically coupled to the display unit 120a through a plurality of driving signal lines 143. The driving signal lines 143 are disposed in the non-display region 140 and connected to the display unit 120a. The driving signal lines 143 transmit the driving signals that are used to drive the display unit 120a from the first pads 142a to the display unit 120a.

Figure 4:
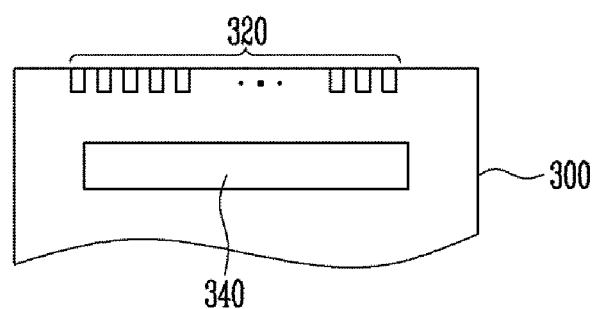
FIG. 4 is a plan view illustrating a printed circuit board according to an exemplary embodiment of the present invention.

FIG. 4 is a plan view illustrating a printed circuit board 300 electrically coupled to the first pad unit 142 according to an exemplary embodiment of the present invention.

In an exemplary embodiment, the printed circuit board 300 includes a plurality of pads 320 that correspond to the plurality of first pads 142a. The printed circuit board 300 is electrically coupled to the first pad unit 142 such that the plurality of pads 320 correspond to the plurality of first pads 142a.

As shown in FIG. 1, in an exemplary embodiment, the second pad unit 144 is disposed at an edge of the first substrate 100 to facilitate contact with probes of an inspection apparatus provided from the outside. For example, as shown in FIG. 1, in an exemplary embodiment, the second pad unit 144 is disposed closer to an edge of the first substrate 100 than the first pad unit 142. In an exemplary embodiment, the second pad unit 144 includes a plurality of second pads 144a that receives various inspection signals that are used to inspect the display unit 120a (e.g., to inspect the display unit 120a for defects). The plurality of second pads 144a are electrically coupled to the display unit 120a through a plurality of inspection signal lines 145. The inspection signal lines 145 are disposed in the non-display region 140 and connected to the display unit 120a. The inspection signal lines 145 transmit the inspection signals used to inspect the display unit 120a from the second pads 144a to the display unit 120a.

In an exemplary embodiment, the third pad unit 146 is disposed adjacent to the second pad unit 144. The third pad unit 146 is used to confirm alignment between the probes of the inspection apparatus and the plurality of second pads 144a. For example, in an exemplary embodiment, the second pad unit 144 and the third pad unit 146 are arranged at predetermined intervals along one side of the first substrate 100. The third pad unit 146 includes a plurality of third pads 146a.

Figure 5:
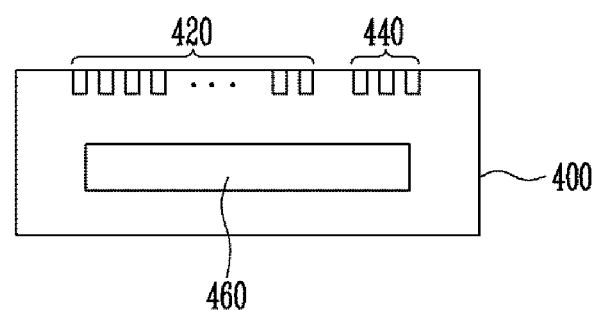
FIG. 5 is a schematic plan view illustrating an inspection apparatus according to an exemplary embodiment of the present invention.

FIG. 5 is a schematic plan view illustrating an inspection apparatus 400 that is electrically coupled to the second pad unit 144 and the third pad unit 146 according to an exemplary embodiment of the present invention.

In an exemplary embodiment, the inspection apparatus 400 includes a plurality of probes 420 and 440 that correspond to the plurality of second pads 144a and the plurality of third pads 146a, respectively. When the inspection apparatus 400 is used to inspect the flat panel display, the probes 420 and 440 respectively contact the second pads 144a and the third pads 146a. As a result, the inspection apparatus 400 is electrically connected to the second pad unit 144 and the third pad unit 146.

In an exemplary embodiment, the inspection apparatus 400 includes a control unit 460. The control unit 460 outputs signals used to confirm alignment, inspect the display unit 120a, etc., and controls various inspection operations according to a signal detected through the probes 440. For example, the control unit 460 of the inspection apparatus 400 outputs the inspection signals that are applied to the second pads 144a to inspect the display unit 120a, and outputs the alignment confirmation signals that are applied to the third pads 146a to confirm alignment between the probes 420 of the inspection apparatus 400 and the second pads 144a.

Figure 6:
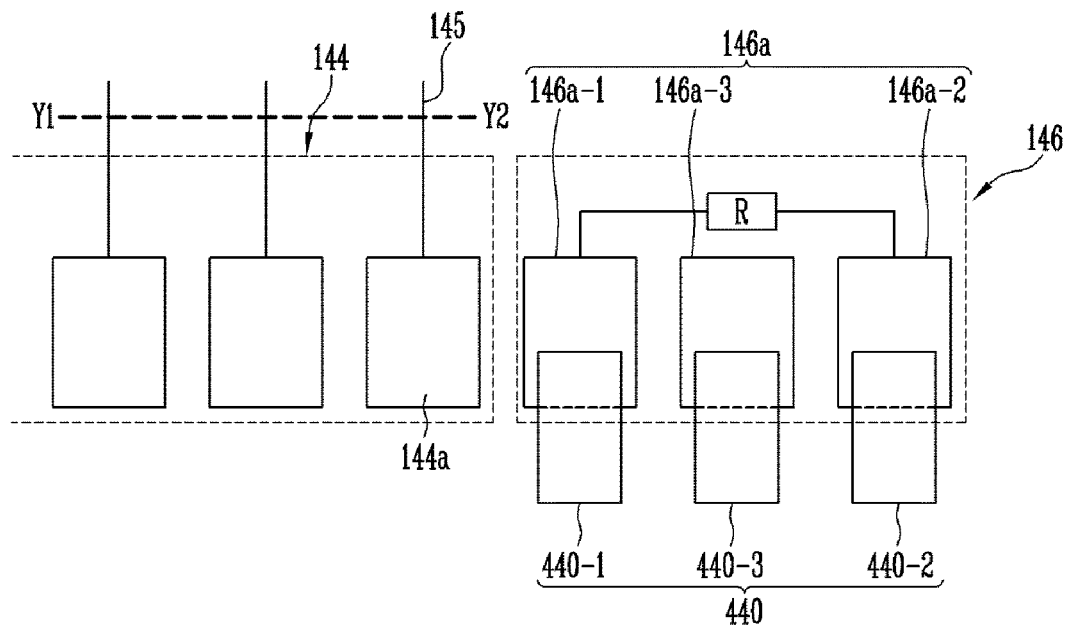
FIGS. 6 to 8 are plan views illustrating second and third pad units according to an exemplary embodiment of the present invention.

FIG. 6 is a plan view illustrating the third pad unit 146 in more detail according to an exemplary embodiment of the present invention.

In an exemplary embodiment, the third pad unit 146 includes a third pad 146a-1 that receives an alignment confirmation signal that is used to confirm alignment, a third pad 146a-2 that outputs the alignment confirmation signal that is used to confirm alignment, and a third pad 146a-3 that receives a reference signal. A resistor R is electrically coupled between the third pad 146a-1 and the third pad 146a-2.

FIG. 6 shows a configuration in which the third pad unit 146 includes three third pads 146a-1, 146a-2, and 146a-3. However, it is to be understood that exemplary embodiments of the present invention are not limited thereto. For example, according to exemplary embodiments, the number of third pads included in the pad unit 146 may be increased.

In an exemplary embodiment, the first pad unit 142 and the driving signal lines 143, the second pad unit 144 and the inspection signal lines 145, and the third pad unit 146 and a signal line coupled to the resistor R, are formed in the process of forming the electrodes 23, 25 and 26 of the thin film transistor 20.

In an exemplary embodiment, the resistor R is formed in the process of forming the semiconductor layer 21 of the thin film transistor 20. For example, the resistance value of the resistor R may be controlled by controlling the concentration of the dopant to be doped in the process of forming the source and drain regions of the semiconductor layer 21.

In an exemplary embodiment, at least one driving circuit unit that drives the display unit 120a is disposed in the non-display region 140 of the first substrate 100. The driving circuit unit may be formed in the non-display region 140 of the first substrate 100 in the process of forming the display unit 120a. Alternatively, the driving circuit unit may be provided as a separate semiconductor integrated circuit (IC) chip and mounted in the non-display region 140 of the first substrate 100.

In an exemplary embodiment, at least one driving circuit unit is provided in the form of a printed circuit board 300 outside the flat panel display, and is electrically coupled to the display unit 120a through the first pad unit 142.

Referring to FIG. 1, in an exemplary embodiment, the at least one driving circuit unit includes a scan driver 160. The scan driver 160 has an input terminal and an output terminal electrically coupled to the first pad unit 142 and a scan line 122, respectively.

Referring to FIG. 4, in an exemplary embodiment, a data driver 340 is provided on the printed circuit board 300. The plurality of pads 320 of the printed circuit board 300 is electrically coupled to the plurality of first pads 142a of the flat panel display. As a result, the data driver 340 is electrically coupled to the data lines 124 through the driving signal lines 143.

In an exemplary embodiment, the data driver is disposed between the display unit 120a and the plurality of first pads 142a. As a result, in an exemplary embodiment, the middle portion of the driving signal line 143 is disconnected, and the input terminal and the output terminal of the data driver are electrically coupled to the disconnected ends, respectively.

In an exemplary embodiment, the flat panel display further includes a control unit. The control unit may receive an image signal from the outside, generate a data signal, and provide the generated data signal to the data driver 340. Also, the control unit may receive a synchronization signal and a clock signal from the outside, generate a control signal, and provide the control signal to the scan driver 160 and the data driver 340.

The pixel 125 is selected by the scan signal provided through the scan line 122, and the current flowing through the pixel 125 is controlled by the data signal provided through the data line 124. As a result, the pixel 125 emits light of a predetermined luminance corresponding to the data signal.

In an exemplary embodiment, the manufacturing process of the flat panel display includes a step of inspecting the display unit 120a.

In an exemplary embodiment, to inspect the display unit 120a, the inspection apparatus 400 is moved to a position such that the probes 420 and 440 correspond to the second pad unit 144 and the third pad unit 146 of the flat panel display, respectively. The probes 420 and 440 are then lowered and pressed against the second pad unit 144 and the third pad unit 146, respectively.

If the probes 420 and the plurality of second pads 144a are misaligned, an electrical signal may be erroneously applied to the display unit 120a during the inspection process, thereby causing defects in the display unit 120a. Thus, the alignment of the probes 420 of the inspection apparatus 400 and the plurality of second pads 144a is confirmed before inspecting the display unit 120a. That is, before the inspection process is performed, it is first confirmed that the probes 420 of the inspection apparatus 400 and the plurality of second pads 144a are aligned.

In an exemplary embodiment, the alignment of the probes 420 and the second pads 144a is confirmed by confirming the degree of alignment between the probes 440 of the inspection apparatus 400 and the plurality of third pads 146a.

Referring to FIG. 6, in an exemplary embodiment, a probe 440-1 of the inspection apparatus 400 is brought into contact with the third pad 146a-1, a probe 440-2 of the inspection apparatus 400 is brought into contact with the third pad 146a-2, and a probe 440-3 of the inspection apparatus 400 is brought into contact with the third pad 146a-3. Voltages are applied through the probes 440-1 and 440-3 to confirm alignment. For example, in an exemplary embodiment, a voltage of +5 V is applied through the probe 440-1 as an inspection signal used to confirm alignment, and a ground voltage is applied through the probe 440-3 as a reference signal.

In an exemplary embodiment, the inspection signal applied through the probe 440-1 is detected by the probe 440-2 via the third pad 146a-1, the resistor R, and the third pad 146a-2 in sequence, and the voltage dropped by the resistor R is detected by the probe 440-2.

For example, in an exemplary embodiment, the control unit 460 of the inspection apparatus 400 compares the voltage of +5 V applied through the probe 440-1 with the voltage detected by the probe 440-2 (for example, +4.7 V). The alignment (or misalignment) is determined by comparing the compared result to a reference value (e.g., +4.5V). When the compared result is lower than the reference value, the control unit 460 determines that there is misalignment.

Figure 7:
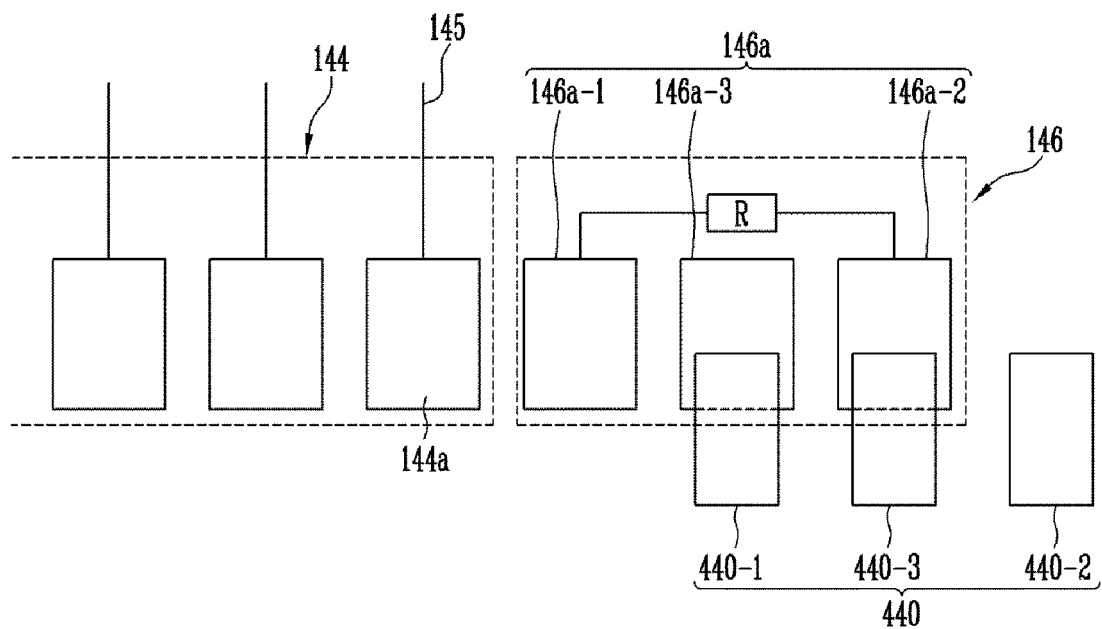

For example, as shown in FIG. 7, when the probes 440 are misaligned in a direction toward the right, the misalignment is determined as a result of the voltage not being detected by the probe 440-2. Alternatively, even when the probes 440 are misaligned in a direction toward the left, misalignment may be determined as a result of the voltage not being detected by the probe 440-2.

Figure 8:
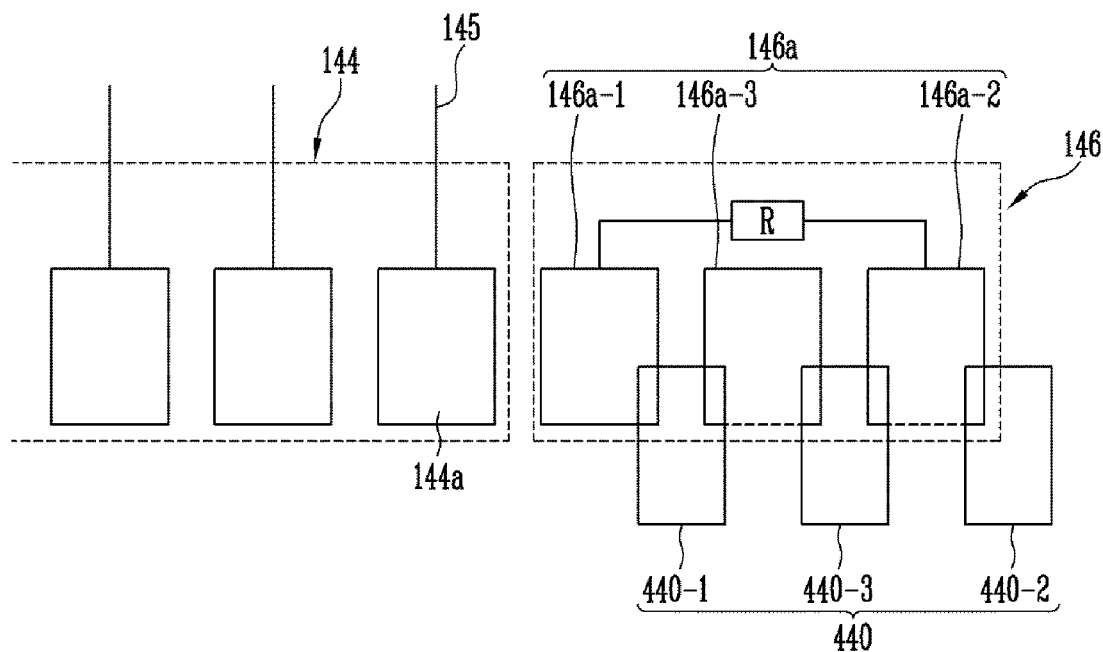

As shown in FIG. 8, in an exemplary embodiment, when all of the third pads 146a-1, 146a-2, and 146a-3 are electrically short-circuited due to misalignment of the probes 440-1, 440-2, and 440-3, misalignment is determined due to the ground voltage being detected by the probe 440-2.

When the misalignment between the probes 420 of the inspection apparatus 400 and the second pad unit 144 of the flat panel display is confirmed as described above, the positions of the probes 420 of the inspection apparatus 400 may be finely adjusted to the left or right. That is, when misalignment is detected, before proceeding with the inspection process, the positions of the probes 420 are adjusted in a direction toward the left or right until alignment is achieved.

In an exemplary embodiment, the probes 420 of the inspection apparatus 400 and the second pad unit 144 of the flat panel display are correctly aligned by repeating the above process.

Once the probes 420 and the second pad unit 144 are correctly aligned, the inspection apparatus 400 provides signals to the second pad unit 144 through the probes 420 to inspect the display unit 120a. Through the inspection process, it may be determined whether a defect(s) exists on the display unit 120a.

In an exemplary embodiment, the signals used to inspect the display unit 120a include signals for inspecting the touch sensing unit 220. Thus, in an exemplary embodiment, it may be determined whether a defect exists in the touch sensing unit 220 through the touch input.

The inspection signal lines 145 connected to the second pads 144a of the second pad unit 144 may be disconnected to block the electrical connection of the second pads 144a and the display unit 120a. For example, the inspection signal lines 145 may be disconnected by directing a laser onto a predetermined portion thereof. The inspection signal lines 145 may include disconnected ends Y1-Y2 that result from the laser (see FIG. 6).

In an exemplary embodiment, the plurality of third pads 146a of the third pad unit 146 is disposed on both sides of the second pad unit 144, respectively.

In an exemplary embodiment, a method of inspecting a flat panel display for defects includes applying the inspection signals to the flat panel display via the second pads 144a, and applying an alignment confirmation signal to a first third pad (e.g., 146a-1 in FIG. 6) from among the plurality of third pads 146a by bringing a first probe (e.g., 440-1 in FIG. 6) of the plurality of probes 440 of the inspection apparatus 400 into contact with the first third pad (e.g., 146a-1 in FIG. 6). The method further includes applying a reference signal (e.g., a ground voltage) to a third third pad (e.g., 146a-3 in FIG. 6) from among the plurality of third pads 146a by bringing a second probe (e.g., 440-3 in FIG. 6) of the plurality of probes 440 into contact with the third third pad 146a-3, detecting a voltage at a second third pad (e.g., 146a-2 in FIG. 6) from among the plurality of third pads 146a, and comparing the voltage detected at the second third pad (e.g., 146a-2 in FIG. 6) with a reference value. In an exemplary embodiment, when the voltage detected at the second third pad (e.g., 146a-2 in FIG. 6) (e.g., the voltage dropped by the resistor R) is lower than the reference value, it is determined that the plurality of probes 440 are misaligned with the second pads 144a. Alternatively, in an exemplary embodiment, when the voltage detected at the second third pad (e.g., 146a-2 in FIG. 6) (e.g., the voltage dropped by the resistor R) is equal to at least the reference value, it is determined that the plurality of probes 440 are aligned with the second pads 144a.

FIGS. 9 to 12 are plan views illustrating the second and third pad units 144 and 146 according to an exemplary embodiment of the present invention.

Figure 9:
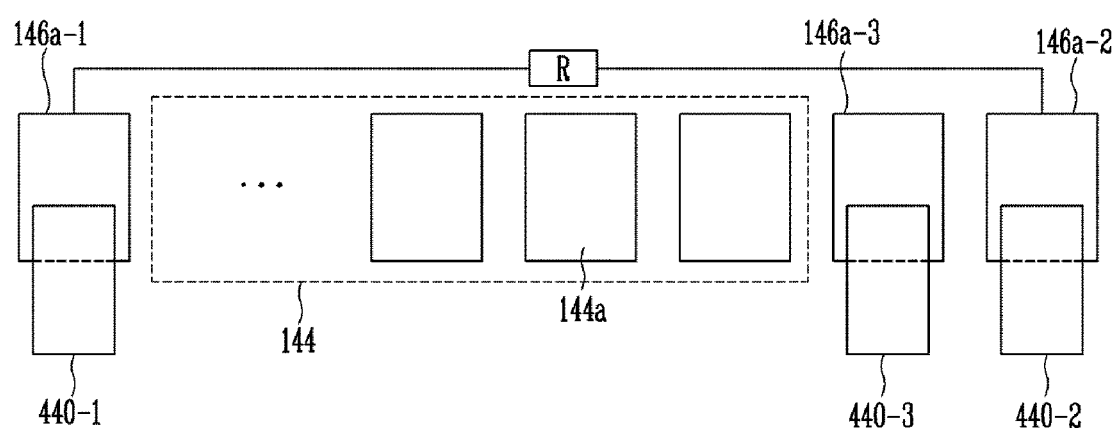
FIGS. 9 to 12 are plan views illustrating second and third pad units according to an exemplary embodiment of the present invention.

Referring to FIG. 9, in an exemplary embodiment, one third pad 146a-1 is disposed on the left side of the second pad unit 144, and two third pads 146-2 and 146-3 are disposed on the right side of the second pad unit 144. The probes 440-1, 440-2 and 440-3 of the inspection apparatus 400 are arranged such that their positions correspond to the third pads 146a-1, 146a-2 and 146a-3, respectively.

Figure 10:
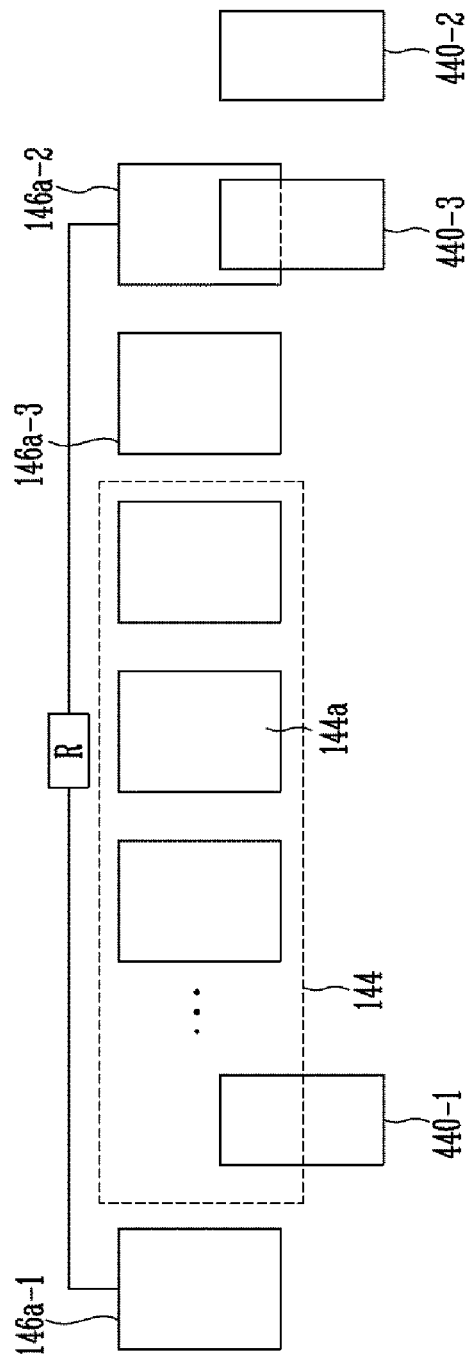
Figure 11:
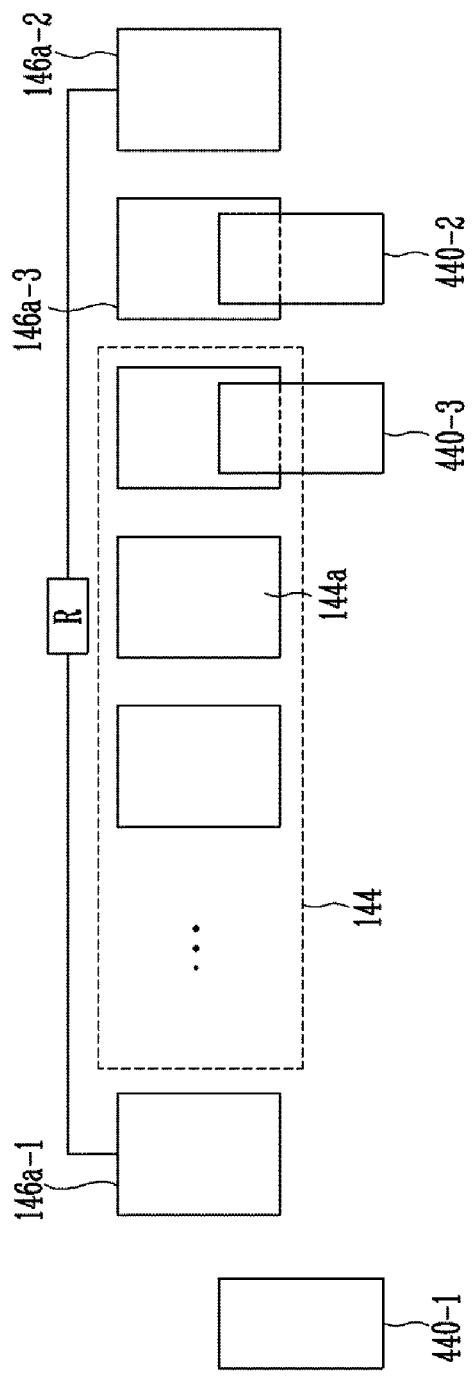

FIG. 10 shows a case in which the probes 440 are misaligned in a direction toward the right. FIG. 11 shows a case in which the probes 440 are misaligned in a direction toward the left.

The procedure for confirming the alignment between the probes 440 of the inspection apparatus 400 and the plurality of third pads 146a is the same as described as above with reference to FIGS. 6 to 8. Thus, for convenience of explanation, a further description thereof will be omitted.

Figure 12:
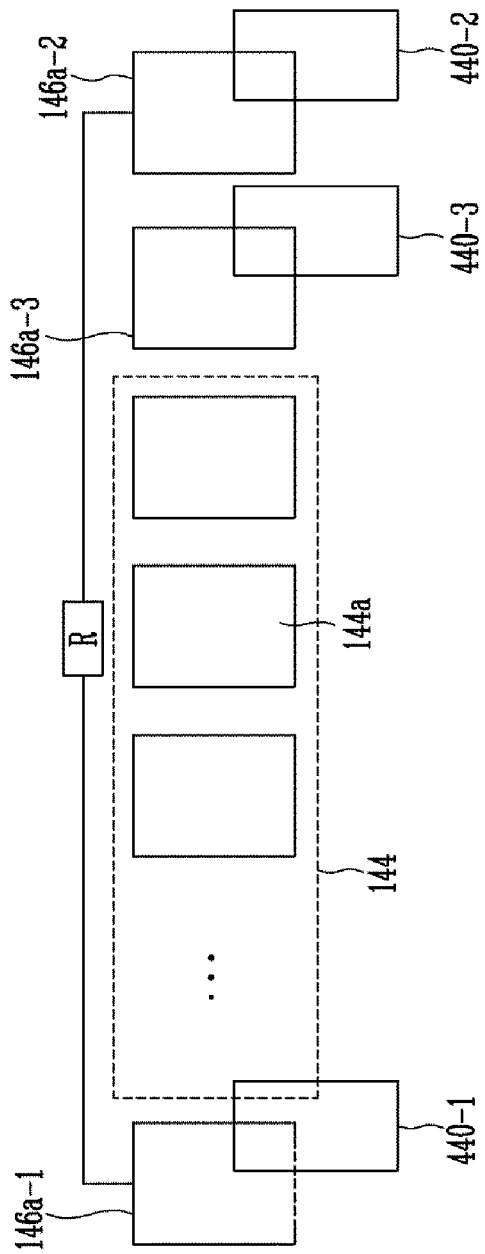

However, when the probes 440 of the inspection apparatus 400 and the plurality of third pads 146a are slightly misaligned, for example, as shown in FIG. 12, if the probes 440 are slightly misaligned in a direction toward the right, small contact areas may be created between the probes 440-1, 440-2, and 440-3 and the third pads 146a-1, 146a-2, and 146a-3, respectively.

In an exemplary embodiment, the first, second, and third pad units 142, 144, and 146 are formed together in the process of forming the electrodes 23, 25, and 26 of the thin film transistor 20. The first, second, and third pad units 142, 144 and 146 may be formed of a metal or an alloy including, for example, Ag, Mg, Al, Pt, Pd, Au, Ni, Nd, Ir, Cr, Li, Ca, Mo, Ti, W, and Cu. In an exemplary embodiment, the first, second, and third pad units 142, 144 and 146 have a small resistance value relative to the probes 440.

When the resistor R is omitted or the resistance value is very small, the inspection signal (for example, +5 V) applied through the probe 440-1 may be transmitted to the probe 440-2 through the third pads 146a-1 and 146a-2.

The voltage of the inspection signal may drop as much as a predetermined contact resistance of the small contact areas between the third pads 146a-1 and 146a-2 and the probes 440-1 and 440-2. However, since a voltage close to about +5 V may be detected by the probe 440-2, the control unit 460 of the inspection apparatus 400 may determine that there is alignment.

However, when the resistor R has a resistance value higher than the self-resistance value of the probes 440-1 and 440-2, a voltage drop (for example, about +4 V) caused by the resistor R and the contact resistance may be detected by the probe 440-2, and the control unit 460 of the inspection apparatus 400 may determine that there is misalignment.

In an exemplary embodiment, the resistor R has a higher resistance value than the probes 440-1 and 440-2. However, when the resistance value of the resistor R is excessively large, it may be difficult to accurately determine the alignment degree due to an excessive voltage drop. Thus, in exemplary embodiments, this relationship may be taken into consideration when determining the resistance value of the resistor R.

FIG. 13 is a plan view illustrating the second and third pad units 144 and 146 according to an exemplary embodiment of the present invention.

When the probes 420 and 440 of the inspection apparatus 400 are pressed on the second and third pad units 144 and 146, partially different tensile forces may be applied to the first substrate 100 due to the difference in the pressing force depending on the position or the material of the first substrate 100. The degree of alignment may partially vary depending on the magnitude of the tension force.

In an exemplary embodiment, the plurality of third pads 146a is provided in two groups, and the plurality of third pads 146a in the two groups may be disposed apart from each other between the plurality of second pads 144a of the second pad unit 144. For example, two third pad units 146 may be separately disposed between the plurality of second pads 144a of the second pad unit 144. For example, as shown in FIG. 13, in an exemplary embodiment, the plurality of third pads 146a includes a first group of third pads 146a and a second group of third pads 146a. The first group of third pads 146a and the second group of third pads 146a are disposed apart from each other, and some of the plurality of second pads 144a are disposed between the first group of third pads 146a and the second group of third pads 146a.

Referring to FIG. 13, in an exemplary embodiment, the two third pad units 146 are disposed in the second pad unit 144 so as to be spaced apart from each other.

Since the degree of alignment can be confirmed by using the two third pad units 146, misalignment can be accurately determined even if the degree of alignment partially varies. As a result, the defect rate due to misalignment can be reduced.

The flat panel display according to exemplary embodiments of the present invention includes the inspection pad unit used to inspect the display unit and the touch sensing unit during the manufacturing process. The inspection pad unit includes inspection pads used to confirm the degree of alignment between the probes of the inspection apparatus and the inspection pads, and a resistor connected between the inspection pads. Misalignment between the probes of the inspection apparatus and the inspection pads may be accurately determined using the resistor.

Exemplary embodiments of the present invention improve the arrangement structure of the inspection pads to effectively confirm misalignment, thereby reducing the defect rate.

While the present invention has been particularly shown and described with reference to the exemplary embodiments thereof, it will be understood by those of ordinary skill in the art that various changes in form and detail may be made therein without departing from the spirit and scope of the present invention as defined by the following claim.

What is claimed is:

1. A flat panel display, comprising:
   a substrate comprising a display region and a non-display region disposed outside of the display region;
   a display unit disposed in the display region, wherein the display unit displays an image;
   a plurality of first pads disposed in the non-display region, wherein the first pads receive a plurality of driving signals used to drive the display unit;
   a plurality of second pads disposed in the non-display region, wherein the second pads receive a plurality of inspection signals used to inspect the display unit;
   a plurality of third pads disposed in the non-display region, wherein the third pads receive a plurality of alignment confirmation signals used to confirm alignment between a plurality of probes of an inspection apparatus and the second pads; and
   a resistor coupled between at least two third pads of the plurality of third pads,
   wherein the plurality of third pads comprises a first group of third pads and a second group of third pads, the first group and the second group are disposed apart from each other, and some of the plurality of second pads are disposed between the first group and the second group.

2. The flat panel display of claim 1, wherein the display unit comprises:
   a plurality of scan lines arranged in a first direction;
   a plurality of data lines arranged in a second direction that crosses the first direction; and
   a plurality of pixels coupled to the plurality of scan lines and the plurality of data lines, wherein each of the pixels comprises:
   a light emitting element; and
   a thin film transistor coupled to the light emitting element.

3. The flat panel display of claim 2, wherein the display unit further comprises:
   a touch sensing unit, wherein the inspection signals comprise signals used to inspect the touch sensing unit.

4. The flat panel display of claim 1, wherein the plurality of third pads is disposed on both sides of the plurality of second pads.

5. The flat panel display of claim 1, wherein the plurality of probes of the inspection apparatus contacts the plurality of second pads and the plurality of third pads, and a resistance value of the resistor is larger than a resistance value of the probes.

6. The flat panel display of claim 1, wherein the plurality of third pads comprises a first third pad that receives one of the alignment confirmation signals, and a second third pad that outputs the received one alignment confirmation signal.

7. A flat panel display, comprising:
   a substrate comprising a display region and a non-display region disposed outside of the display region;
   a display unit disposed in the display region, wherein the display unit displays an image;
   a plurality of first pads disposed in the non-display region and coupled to a plurality of driving signal lines, wherein the driving signal lines are disposed in the non-display region and connected to the display unit, and the driving signal lines transmit a plurality of driving signals used to drive the display unit from the first pads to the display unit;

a plurality of second pads disposed in the non-display region and coupled to a plurality of inspection signal lines, wherein the inspection signal lines are disposed in the non-display region and connected to the display unit, and the inspection signal lines transmit a plurality of inspection signals used to inspect the display unit from the second pads to the display unit;

a plurality of third pads disposed in the non-display region; and a resistor coupled between at least two third pads of the plurality of third pads, wherein the plurality of third pads comprises a first group of third pads and a second group of third pads, the first group and the second group are disposed apart from each other, and some of the plurality of second pads are disposed between the first group and the second group.

8. The flat panel display of claim 7, wherein the plurality of third pads is disposed on both sides of the plurality of second pads.

9. The flat panel display of claim 7, wherein the inspection signals are applied to the second pads via a plurality of probes of an inspection apparatus via the probes contacting the second pads.

10. The flat panel display of claim 9, wherein the display unit comprises a touch sensing unit, and the inspection signals comprise signals used to inspect the touch sensing unit.

11. The flat panel display of claim 7, wherein the third pads receive a plurality of alignment confirmation signals used to confirm alignment between a plurality of probes of an inspection apparatus and the second pads via the probes contacting the third pads.

12. The flat panel display of claim 11, wherein the plurality of third pads comprises a first third pad that receives one of the alignment confirmation signals, and a second third pad that outputs the received one alignment confirmation signal.

13. The flat panel display of claim 11, wherein a resistance value of the resistor is larger than a resistance value of the probes of the inspection apparatus.

14. The flat panel display of claim 7, wherein the inspection signal lines comprise disconnected ends.

15. The flat panel display of claim 7, wherein the second pads and the third pads are arranged at predetermined intervals along one side of the substrate.

16. A method of inspecting a flat panel display for defects, comprising:
applying a plurality of inspection signals to the flat panel display via a plurality of second pads;
applying an alignment confirmation signal to a first third pad from among a plurality of third pads by bringing a first probe of a plurality of probes of an inspection apparatus into contact with the first third pad,
wherein the flat panel display comprises a display region and a non-display region disposed outside of the display region, and a plurality of first pads, the plurality of second pads, and the plurality of third pads are disposed in the non-display region;
applying a reference signal to a third third pad from among the plurality of third pads by bringing a second probe of the plurality of probes into contact with the third third pad;
detecting a voltage at a second third pad from among the plurality of third pads, wherein the second third pad is electrically connected to the first third pad by a resistor;
comparing the voltage detected at the second third pad with a reference value;
determining that the plurality of probes and the second pads are misaligned in response to the voltage detected at the second third pad being lower than the reference value; and
determining that the plurality of probes and the second pads are aligned in response to the voltage detected at the second third pad being equal to at least the reference value.

17. The method of claim 16, wherein the reference signal applied to the third third pad is a ground voltage.

18. The method of claim 16, wherein a resistance value of the resistor is larger than a resistance value of the plurality of probes.

* * * * *